United States Patent
Yan et al.

(10) Patent No.: US 7,716,821 B2
(45) Date of Patent: May 18, 2010

(54) METHOD OF MANUFACTURING A CIRCUIT BOARD ASSEMBLY FOR A CONTROLLER

(75) Inventors: Xiao Yan, Plymouth, MN (US); Thomas J. Bergherr, Dayton, MN (US)

(73) Assignee: Sauer-Danfoss Inc., Ames, IA (US)

( * ) Notice: Subject to any disclaimer, the term of this patent is extended or adjusted under 35 U.S.C. 154(b) by 160 days.

(21) Appl. No.: 11/954,419

(22) Filed: Dec. 12, 2007

(65) Prior Publication Data

US 2009/0151156 A1   Jun. 18, 2009

(51) Int. Cl.
*H05K 3/30* (2006.01)
(52) U.S. Cl. .............................. 29/830; 29/842; 29/843; 228/180.22; 361/784
(58) Field of Classification Search ................... 29/830, 29/842, 843; 228/180.22; 361/784
See application file for complete search history.

(56) References Cited

U.S. PATENT DOCUMENTS

| | | | | |
|---|---|---|---|---|
| 2,894,241 | A * | 7/1959 | McKee ........................ | 439/65 |
| 4,109,298 | A | 8/1978 | Hanni et al. | |
| 4,705,205 | A * | 11/1987 | Allen et al. ............. | 228/180.22 |
| 5,098,305 | A * | 3/1992 | Krajewski et al. ............. | 439/75 |
| 5,321,585 | A * | 6/1994 | Trittschuh et al. ........... | 361/784 |
| 5,455,742 | A | 10/1995 | Phoy et al. | |
| 5,484,965 | A * | 1/1996 | Woychik ..................... | 174/262 |
| 5,543,586 | A * | 8/1996 | Crane et al. .................. | 174/262 |
| 5,648,892 | A * | 7/1997 | Wieloch et al. .............. | 361/788 |
| 5,659,953 | A * | 8/1997 | Crane et al. .................... | 29/843 |
| 5,754,411 | A * | 5/1998 | Woychik ..................... | 361/803 |
| 5,808,867 | A | 9/1998 | Wang | |
| 5,825,630 | A | 10/1998 | Taylor et al. | |
| 5,907,475 | A * | 5/1999 | Babinski et al. ............. | 361/719 |
| 6,065,978 | A | 5/2000 | Dehan et al. | |
| 6,267,604 | B1 * | 7/2001 | Mickievicz et al. ........... | 439/79 |
| 6,399,893 | B1 | 6/2002 | Terashima | |
| 6,409,522 | B1 | 6/2002 | Onizuka | |
| 6,422,876 | B1 * | 7/2002 | Fitzgerald et al. ............. | 439/61 |
| 6,496,384 | B1 * | 12/2002 | Morales et al. .............. | 361/784 |
| 6,623,302 | B2 * | 9/2003 | Billman et al. ......... | 439/607.07 |
| 6,913,468 | B2 * | 7/2005 | Dozier et al. ................. | 439/66 |
| 2002/0034068 | A1 | 3/2002 | Weber et al. | |
| 2002/0071259 | A1 * | 6/2002 | Roos .......................... | 361/784 |
| 2006/0070768 | A1 | 4/2006 | Lee | |

FOREIGN PATENT DOCUMENTS

EP            1056319  A2    11/2000

* cited by examiner

*Primary Examiner*—C. J Arbes

(57) ABSTRACT

A method of manufacturing a circuit board assembly for a controller. The method includes providing first and second printed circuit boards wherein the first printed circuit board has a plurality of copper pads containing slots therein that correspond to a plurality of power tabs in the second printed circuit board. The power tabs are then slid into the slots and the tabs are flooded with copper. At this time the power tabs are soldered within the slots to provide an electrical connection between the first and second printed circuit boards that allows for the transfer of current between the boards of more than three amps.

13 Claims, 4 Drawing Sheets

METHOD OF MANUFACTURING A CIRCUIT BOARD ASSEMBLY FOR A CONTROLLER

BACKGROUND OF THE INVENTION

This invention relates to a circuit board assembly for controllers. More specifically, this invention relates to a method of manufacturing a circuit board assembly using a mortise and tenon type connection.

The need to transfer high currents (larger than 3 amps) into and out of machine controllers has been constantly on the rise. More importantly, there is a need in many applications for power management as opposed to machine control for which general products are primarily designed. Applications include skid steer loaders, tractor-loader-backhoes, garbage trucks and directional drills. The types of devices to control include high intensity lights, warning beacons, fuel solenoids, wiper motors and seat heaters. These types of elements exist on most applications and by adding these elements to a vehicle control system causes additional automation, timing features and reduces the need for fusing.

For a controller to manage these high power requirements the current must be brought into the circuit board. Often the main circuitry resides on a PCB (printed circuit board) that is perpendicular to the connector board because of enclosure design. To connect the main board with the connector board, a right angle connector is usually used. However, most right angle connectors are not capable of carrying large amounts of current without sacrificing board space.

Another condition present in circuit boards is to minimize the amount of heat that is generated when transferring current. One solution could be a custom made copper tab that provides a connection between a main board and a connector board. However, this solution would appear extremely costly. Thus, there is a need in the art for a cost effective method of manufacturing circuit board assemblies that minimizes the amount of heat presented as a result of a large amount of current being passed between the main board and the connector board.

Thus, a principle object of the present invention is to provide a circuit board assembly that transfers current of larger than 3 amps between two printed circuit boards.

Yet another object of the present invention is to provide a cost effective method of manufacturing a circuit board assembly.

Another object of the present invention is to provide a circuit board assembly that produces a minimum amount of heat during the transmission of current from a main board to a connector board.

These and other objects, features or advantages of the present invention will become apparent from the specification and claims.

BRIEF SUMMARY OF THE INVENTION

A method of manufacturing a circuit board assembly for a controller. This method includes providing a first printed circuit board having a plurality of copper pads therein wherein each copper pad has a slot disposed therethrough. A second printed circuit board is then provided that has a plurality of power tabs that correspond with the copper pads, specifically the slots within the copper pads of the first printed circuit board. The power tabs of the second printed circuit board are then slid through the slots of the first printed circuit board to provide an electrical connection between the first and second printed circuit boards wherein current can pass from the first printed circuit board and to the second printed circuit board. The plurality of power tabs are then flooded with copper to the edge of the second printed circuit board to maximize current carrying capability between the first printed circuit board and the second printed circuit board. Finally, the power tabs are soldered to the copper pads to finalize the connection between the first and second printed circuit boards.

DETAILED DESCRIPTION OF THE PREFERRED EMBODIMENT

Figure 1:
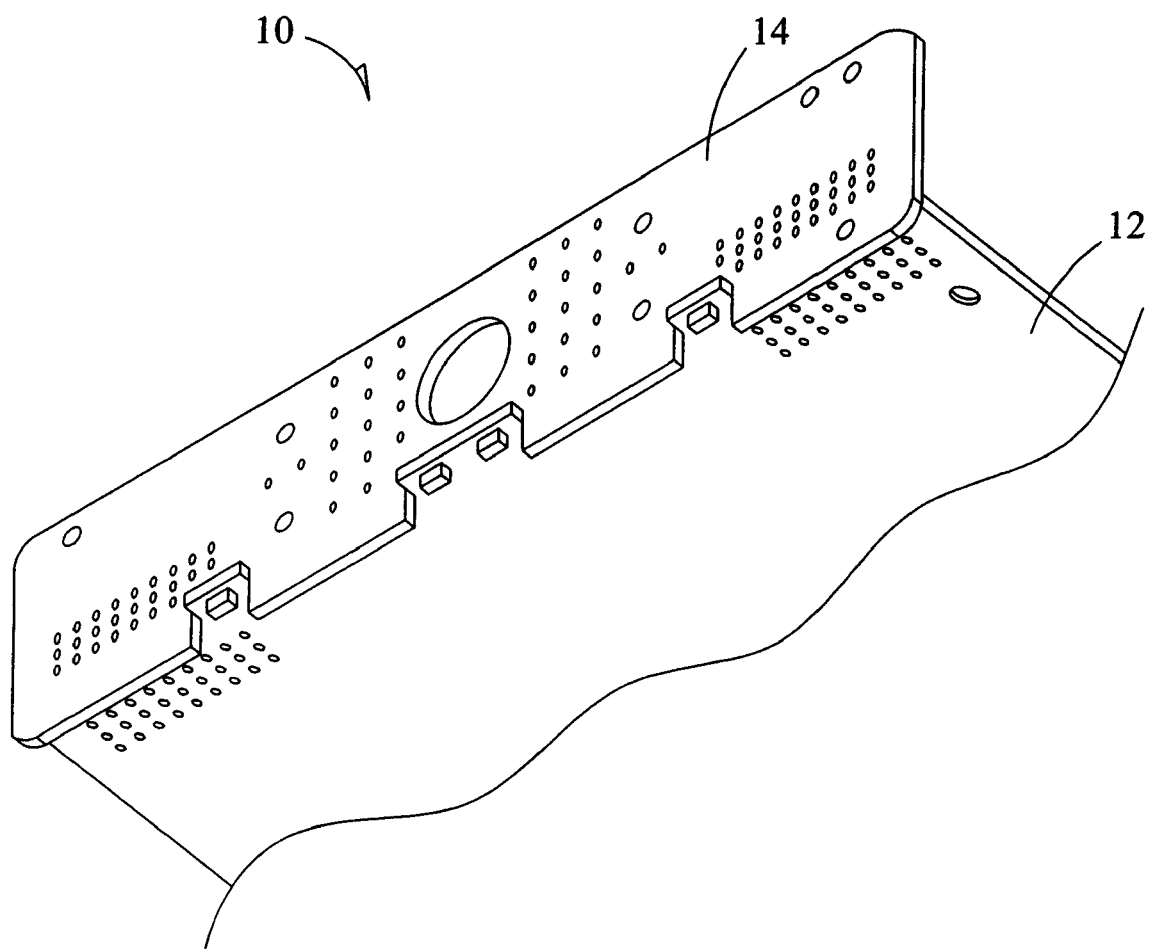
FIG. 1 is a side perspective view of a circuit board assembly.
Figure 2:
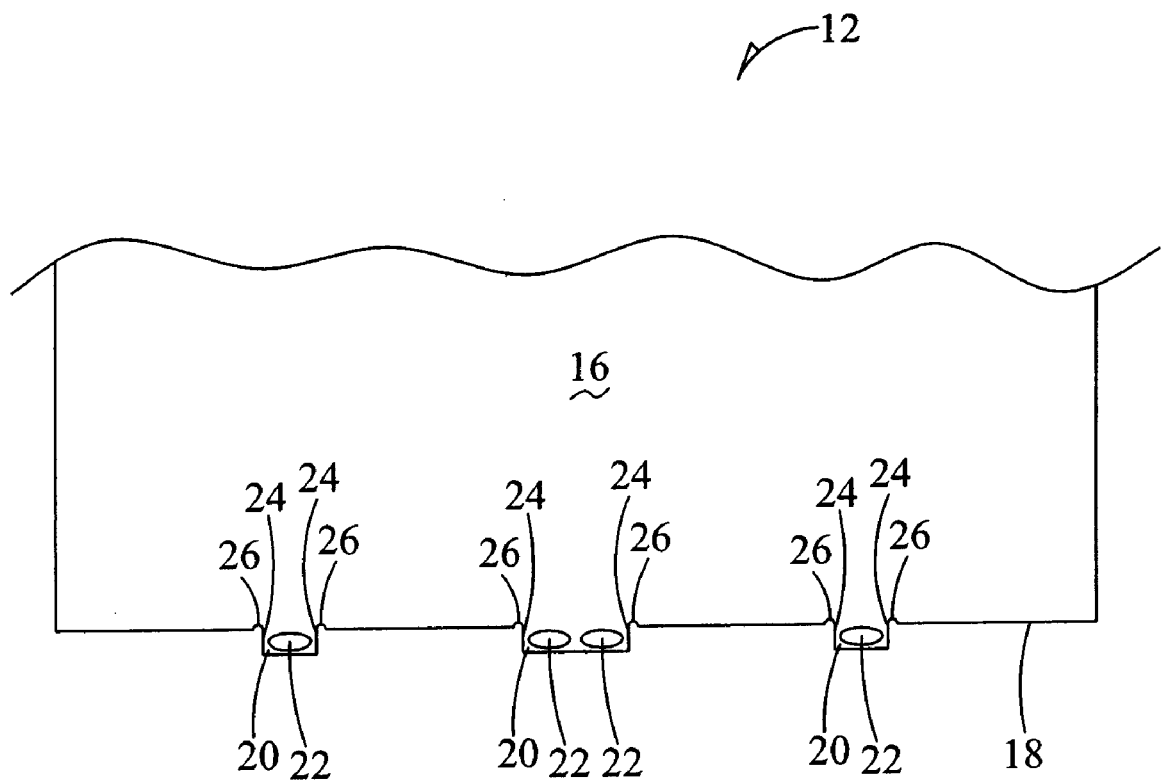
FIG. 2 is a side plan view of a first printed circuit board.
Figure 3:
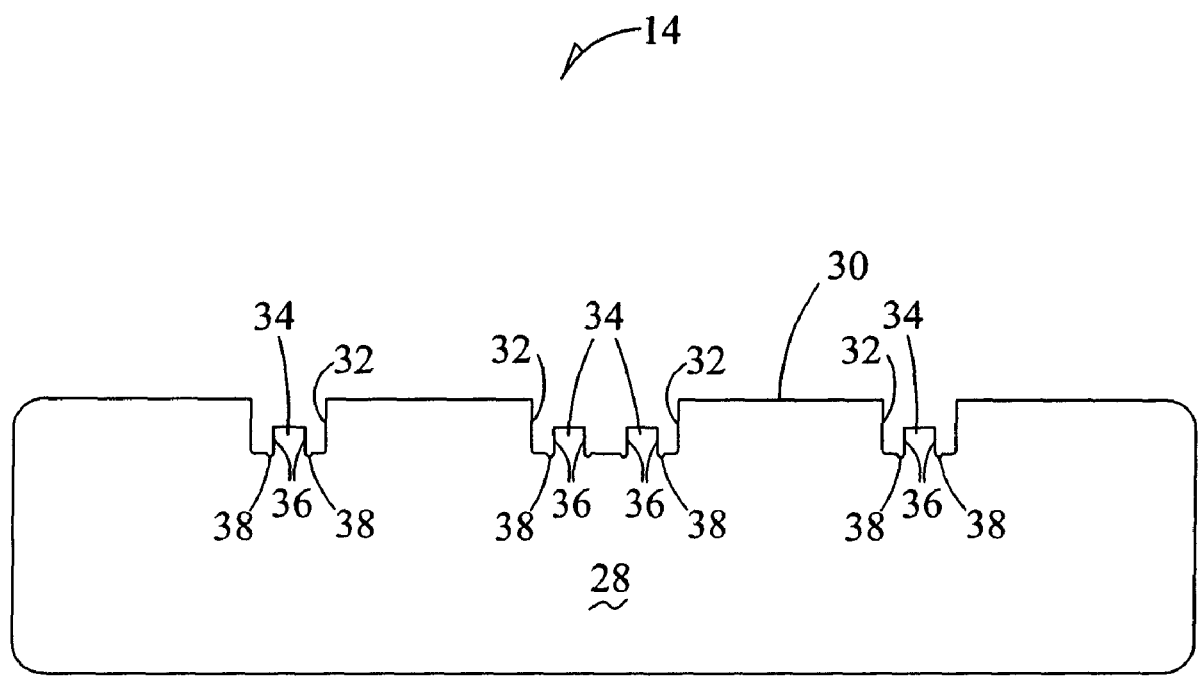
FIG. 3 is a side plan view of a second printed circuit board.

FIG. 1 shows a circuit board assembly 10 that is comprised of a first printed circuit board 12 and a second printed circuit board 14. In a preferred embodiment the first printed circuit board 12 is considered a main board whereas the second printed circuit board 14 is considered a connector board. Both the first and second printed circuit boards 12, 14 are printed as is known in the art.

The first printed circuit board 12 has an elongated body 16 having first and second sides 17a and 17b with an edge 18. Edge 18 includes a plurality of copper pads 20 extending therefrom. The plurality of copper pads 20 have slots 22 disposed therethrough. The slots 22 in a preferred embodiment are plated; however, to minimize cost do not have to be plated. Similarly, the copper pads 20 may or may not be plated depending on cost constraints. Each of the copper pads 20 additionally have a base 24 wherein adjacent the base 24 undercut radii 26 are provided to enhance soldering.

The second printed circuit board 14 also has an elongated body 28 with an edge 30. The edge 30 has a plurality of cavities 32 disposed therein that correspond to the copper pads 20 of the first printed circuit board 12. The plurality of cavities 30 have power tabs 34 disposed therein that in a preferred embodiment are made of copper. Also, preferably the power tabs 34 do not have a solder mask such that the copper is exposed to be soldered to the first printed circuit board 12. Much like the copper pads 20 of the first printed circuit board the power tabs 34 of the second printed circuit board 14 have a base 36 wherein undercut radii 38 are positioned adjacent the bases 36 to enhance soldering.

Figure 4:
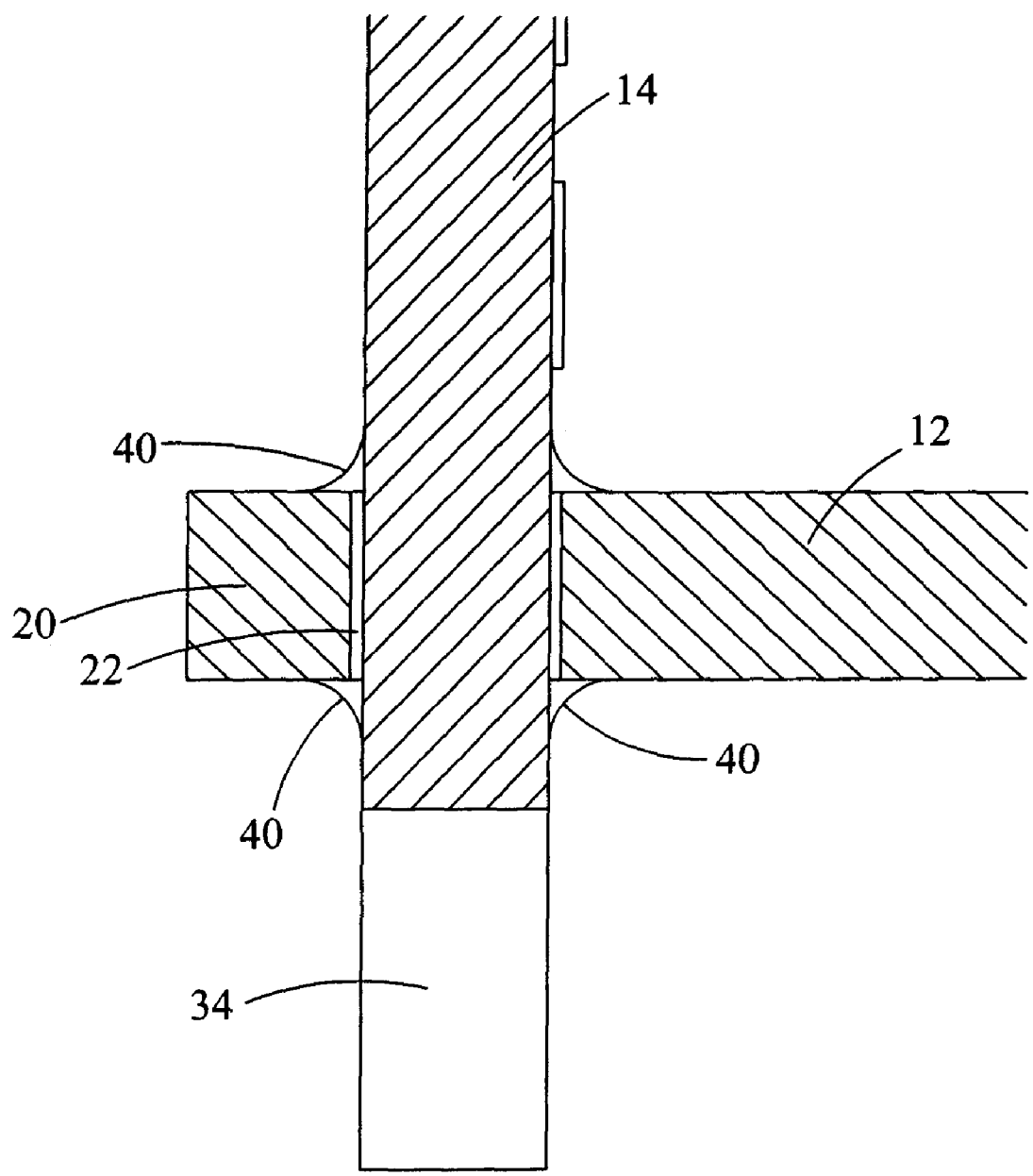
FIG. 4 is a side sectional view of a connection between a first and second printed circuit board.

Thus, the first and second printed circuit boards 12, 14 are designed such that the power tabs 34 are disposed through the slots 22 to connect the first and second printed circuit boards 12, 14 at a right angle and to fully support the connections without additional connections therein. While additional connections can be presented, with the present design additional connection points are unneeded and thus provide cost savings over other such connections. When a power tab 36 is slid into a slot 22 a plurality of solder points 40 are presented as best shown in FIG. 4.

During the manufacturing process the second printed circuit board 14 or connector board is first populated and then reflowed. Solder paste is then placed on a first side 17a of the first printed circuit board 12 on and over the slots 22. An operator then slides the power tabs 34 of the second printed circuit board 14 through the slots 22 of the first printed circuit board 12 thus pushing the solder paste to the second side 17b of the first printed circuit board 12. Therefore, the power tabs 34 must be of a length such that they are short enough to utilize the pushed through solder paste but not too short to loose the connection created by being disposed through the slots 22.

Once the power tabs 34 are slid through the slots 22 the first printed circuit board 12 is held perpendicular to the second printed circuit board 14. While optionally right angle connections that can carry input and output signals can be used to hold the first and second printed circuit boards 12, 14 perpendicular to one another, these are unneeded.

Once the power tabs 34 are disposed through the slots 22 the second printed circuit board 14 or connector board is then reflowed again with the first printed circuit board 12 or main board. At this time to maximize the current carrying capability of this design and solderability the power tabs 34 are flooded with copper to the edge 30 of the second printed circuit board 14.

Finally, the power tabs 34 are soldered within the slots 22 in order to complete the connection. As best shown in FIG. 4 the tabs and slots are carefully designed to ensure top and bottom layers of both the first and second printed circuit boards 12, 14 are soldered together for a total of four solder points 40 per tab. Specifically, the undercut radii 26, 38 within both the first and second printed circuit boards 12, 14 improve solderability and ensure dimensional repeatability as an assembly.

The end result is the connection of two separate printed circuit boards wherein the connection between the two boards also represents the electrical connection between the boards such that the transfer of high currents such as those currents larger than 3 amps are passed through the boards. This connection and manufacturing process not only is inexpensive but additionally repeatable. Further, a minimum amount of heat is produced as a result of the circuit board assembly 10 and as a result, at the very least, all of the stated objectives have been met.

It will be appreciated by those skilled in the art that other various modifications could be made to the device without departing from the spirit and scope of this invention. All such modifications and changes fall within the scope of the claims and are intended to be covered thereby.

What is claimed is:

1. A method of manufacturing a circuit board assembly for a controller, steps comprising:

providing a first printed circuit board having a plurality of copper pads with a slot disposed through at least one of the plurality of copper pads;

providing a second printed circuit board having a plurality of power tabs that correspond to the plurality of copper pads;

sliding at least one power tab through the slot to provide an electrical connection between the first and second printed circuit board wherein current passes from the first printed circuit board to the second printed circuit board; and flooding the plurality of power tabs with copper to an edge of the second printed circuit board to maximize the current carrying capability between the first printed circuit board and the second printed circuit board.

2. The method of claim 1 wherein the slot is plated.

3. The method of claim 1 wherein the power tabs do not have a solder mask.

4. The method of claim 1 wherein the only connection between the first printed circuit board and the second printed circuit board are power tabs being disposed through slots.

5. The method of claim 1 wherein the plurality of copper pads each have a base wherein cut radii are located adjacent each base for enhanced soldering.

6. The method of claim 1 wherein the plurality of power tabs each have a base wherein cut radii are located adjacent the base for enhanced soldering.

7. The method of claim 1 further comprising the step of placing soldering paste on a first side of the slot.

8. The method of claim 7 further comprising the step of pushing the soldering paste through the first side of the slot to a second side of the slot with a power tab as the power tab is disposed through the slot.

9. The method of claim 8 further comprising the step of soldering the power tab at both the first and second sides of the slot to a copper pad.

10. The method of claim 1 wherein the sliding of at least one power tab through the slot secures the first printed circuit board perpendicular to the second printed circuit board.

11. The method of claim 1 wherein the copper pads extend outwardly from an edge of the first printed circuit board.

12. The method of claim 1 wherein the power tabs extend outwardly from an edge of the second printed circuit board.

13. The method of claim 1 wherein an edge of the first printed circuit board is positioned in an intermeshing relation with an edge of the second printed circuit board.

* * * * *